(12) United States Patent
Shiiba et al.

(10) Patent No.: US 12,336,124 B2
(45) Date of Patent: Jun. 17, 2025

(54) PLUG, ELECTRONIC COMPONENT STORING PACKAGE INCLUDING THE SAME, AND ELECTRONIC MODULE INCLUDING THE SAME

(71) Applicant: KYOCERA Corporation, Kyoto (JP)

(72) Inventors: Reiko Shiiba, Kirishima (JP); Masahiko Taniguchi, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/805,659

(22) Filed: Aug. 15, 2024

(65) Prior Publication Data
US 2025/0040071 A1    Jan. 30, 2025

Related U.S. Application Data

(63) Continuation of application No. PCT/JP2024/024056, filed on Jul. 3, 2024.

(30) Foreign Application Priority Data

Jul. 24, 2023 (JP) .................................. 2023-119689

(51) Int. Cl.
*H05K 5/02* (2006.01)
*H01B 17/26* (2006.01)

(52) U.S. Cl.
CPC ........... *H05K 5/0247* (2013.01); *H01B 17/26* (2013.01)

(58) Field of Classification Search
CPC .... H05K 5/0247; H05K 5/0217; H01B 17/26; H01B 17/28; H01B 17/30; H01B 17/56

USPC ..... 174/520, 152 GM, 650, 50.51, 527, 535; 439/586, 587, 604; 361/302, 306.1; 607/36, 37
See application file for complete search history.

(56) References Cited

U.S. PATENT DOCUMENTS

| 4,421,947 A | 12/1983 | Kyle | |
| 6,643,903 B2* | 11/2003 | Stevenson | A61N 1/3754 361/309 |
| 6,852,925 B2* | 2/2005 | Wolf | H01M 50/172 174/50.56 |
| 6,903,268 B2* | 6/2005 | Marshall | A61N 1/3754 361/302 |

(Continued)

FOREIGN PATENT DOCUMENTS

| JP | 2002231841 A | 8/2002 |
| JP | 2004320067 A | 11/2004 |

(Continued)

*Primary Examiner* — Angel R Estrada
(74) *Attorney, Agent, or Firm* — Volpe Koenig

(57) ABSTRACT

A plug includes a metal body, an insulator, and a conductor pin. The metal body includes a first surface, a second surface opposite the first surface, and a first through-hole penetrating from the first surface to the second surface. The insulator is disposed in the first through-hole. The insulator includes a third surface disposed on a side of the first surface, a fourth surface opposite the third surface, and a second through-hole penetrating from the third surface to the fourth surface. The conductor pin is disposed in the second through-hole and protrudes at least from the third surface. The metal body further includes a first groove disposed in the first surface. The first groove is spaced from a first outer edge of the metal body.

20 Claims, 8 Drawing Sheets

(56) References Cited

U.S. PATENT DOCUMENTS

| | | | | |
|---|---|---|---|---|
| 7,300,310 | B2* | 11/2007 | Taylor | H01R 24/50 |
| | | | | 439/586 |
| 7,564,674 | B2* | 7/2009 | Frysz | H01G 4/35 |
| | | | | 361/301.2 |
| 8,276,514 | B2* | 10/2012 | Fink | F42B 3/198 |
| | | | | 65/59.1 |
| 8,288,654 | B2* | 10/2012 | Taylor | A61N 1/05 |
| | | | | 65/59.1 |
| 8,519,280 | B2* | 8/2013 | Teske | A61N 1/3754 |
| | | | | 174/650 |
| 9,009,935 | B2* | 4/2015 | Iyer | H01G 2/106 |
| | | | | 29/25.42 |
| 2006/0286863 | A1 | 12/2006 | Taylor | |

FOREIGN PATENT DOCUMENTS

| | | |
|---|---|---|
| JP | 2012009172 A | 1/2012 |
| JP | 2012134350 A | 7/2012 |

* cited by examiner

PLUG, ELECTRONIC COMPONENT STORING PACKAGE INCLUDING THE SAME, AND ELECTRONIC MODULE INCLUDING THE SAME

TECHNICAL FIELD

The present disclosure relates to a plug, an electronic component storing package including the same, and an electronic module including the same.

BACKGROUND OF INVENTION

A coaxial connector of related art is described, for example, in Patent Literature 1.

CITATION LIST

Patent Literature

Patent Literature 1: Japanese Unexamined Patent Application Publication No. 2004-320067.

SUMMARY OF THE INVENTION

In an embodiment, (1) a plug includes a metal body, an insulator, and a conductor pin. The metal body includes a first surface, a second surface opposite the first surface, and a first through-hole penetrating from the first surface to the second surface. The insulator is disposed in the first through-hole. The insulator includes a third surface disposed on a side of the first surface, a fourth surface opposite the third surface, and a second through-hole penetrating from the third surface to the fourth surface. The conductor pin is disposed in the second through-hole and protrudes at least from the third surface. The metal body further includes a first groove disposed in the first surface. The first groove is spaced from a first outer edge of the metal body.

(2) In the plug according to (1), the first groove is disposed along the first outer edge.

(3) In the plug according to (1) or (2), in plan view, a distance L1 from the insulator to the first outer edge of the metal body is greater than a distance L2 from the conductor pin to a second outer edge of the insulator.

(4) In the plug according to any one of (1) to (3), the first groove is annular in plan view.

(5) In the plug according to any one of (1) to (4), the metal body includes a side surface and an inclined surface. The side surface is configured to connect the first surface to the second surface. The inclined surface extends at an angle from the second surface to the side surface.

(6) In the plug according to any one of (1) to (5), when a direction in which the conductor pin extends is defined as a first direction, a dimension of protrusion of the conductor pin from the third surface in the first direction is equal to or greater than a dimension of protrusion of the conductor pin from the fourth surface in the first direction.

(7) In the plug according to any one of (1) to (6), the metal body is disc-shaped in plan view.

(8) In the plug according to any one of (1) to (7), in cross-sectional view, a width of the first groove decreases from the first surface toward the second surface.

(9) In the plug according to any one of (3) to (8), in plan view, a distance L3 from the first groove to the first outer edge is smaller than a distance L4 from the second outer edge to the first groove.

(10) In the plug according to any one of (1) to (9), the third surface is concave toward an inside.

(11) In the plug according to (4), the metal body includes one or more second grooves spaced from the first groove.

(12) In an embodiment, an electronic component storing package includes the plug according to any one of (1) to (11) and a box. The box includes a first recess in which the plug is disposed, and a third through-hole connected to the first recess and configured to allow the conductor pin to pass therethrough. The first recess includes a first bottom surface in contact with the second surface.

(13) In the electronic component storing package according to (12), the box further includes a second recess disposed in the first bottom surface. The second recess is spaced from the insulator. A diameter of the second recess is smaller than a diameter of the first recess, and greater than a diameter of the insulator and a diameter of the third through-hole.

(14) In the electronic component storing package according to (12) or (13), the box further includes a third recess continuous with the first recess and disposed opposite the third through-hole. The third recess includes a second bottom surface where the first recess is disposed. The third recess is greater than the first recess, in plan view. In plan view, the first surface is disposed outside the second bottom surface.

(15) The electronic component storing package according to (14) further includes a bonding material disposed between the box and the plug. The box further includes a stepped portion configured to connect the third recess to the first recess and disposed in the second bottom surface. The bonding material extends from a gap between the first recess and the plug to the stepped portion.

(16) The electronic component storing package according to any one of (12) to (15) further includes a receptacle into which the conductor pin is fitted and with which the first surface comes into contact.

(17) In an embodiment, an electronic module includes the electronic component storing package according to any one of (12) to (16), an electronic component contained in the box, and a lid disposed over the box.

DESCRIPTION OF THE INVENTION

The invention described in Patent Literature 1 requires that to reduce impedance fluctuation, a coaxial cable and a cylindrical securing member (which may be collectively referred to as a receptacle) be pressed against, and brought into contact with, a coaxial connector (also referred to as a plug) to reduce a gap with the coaxial connector. Therefore, a plug that is less likely to be damaged even when pressed against the receptacle is required.

<Configuration of Plug>

Hereinafter, some exemplary embodiments will be described with reference to the drawings. Although any direction of a plug may be defined as an upward or downward direction, an orthogonal coordinate system xyz is defined and a positive side in the z direction is defined as an upward direction for convenience. In the present disclosure, a plan view is a concept that includes a transparent plan view.

Figure 1:
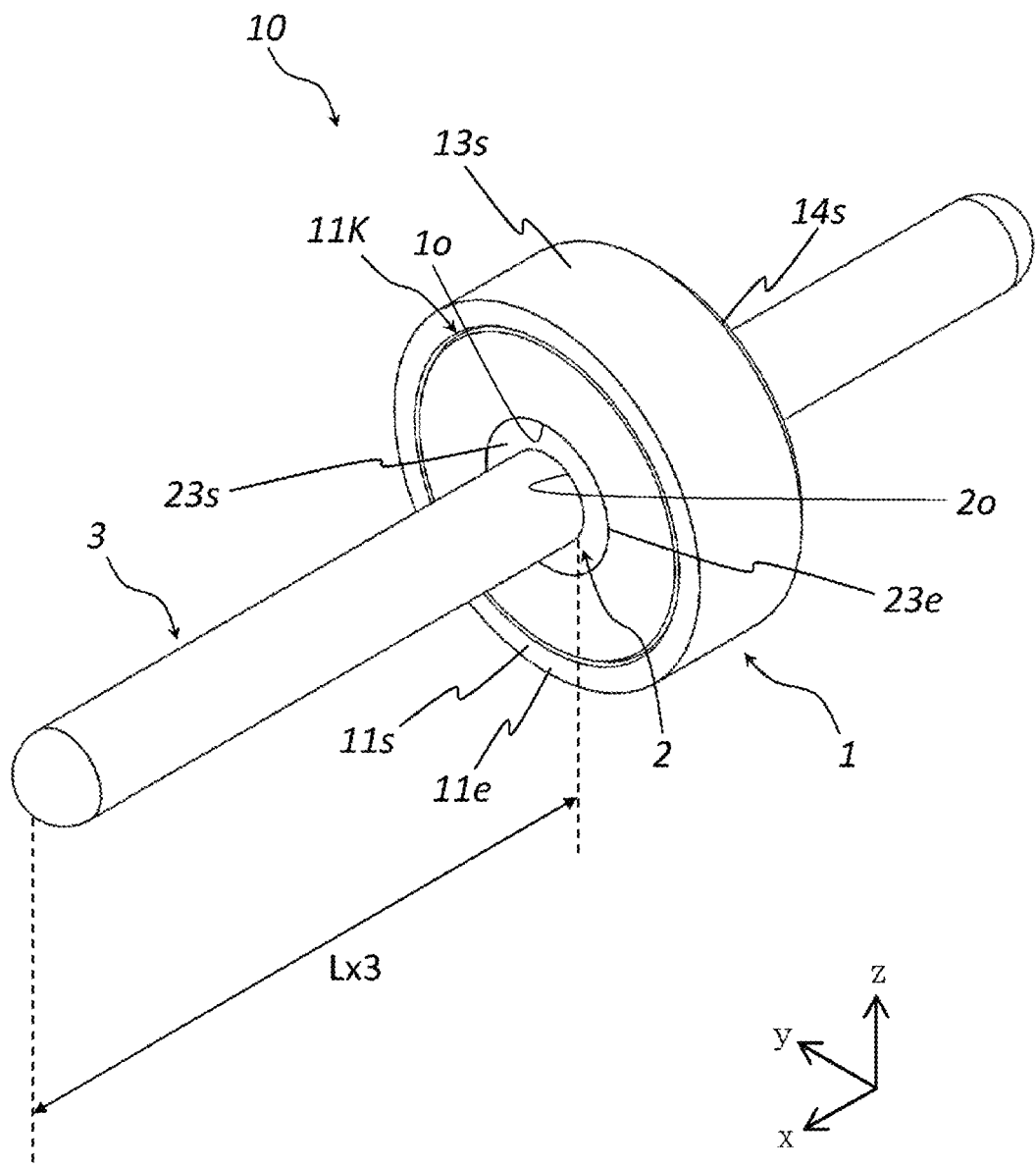
FIG. 1 is a perspective view of a plug according to an embodiment.
Figure 2:
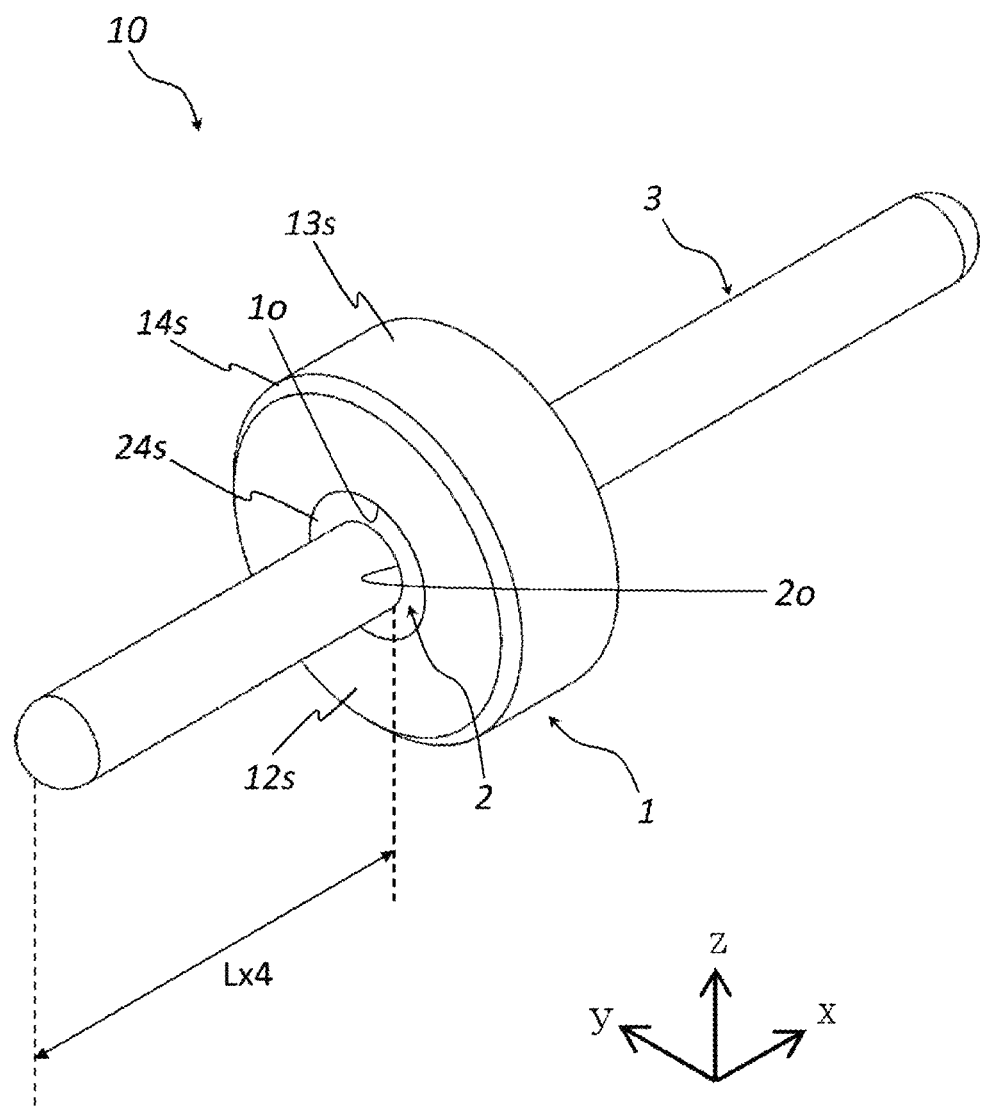
FIG. 2 is a perspective view of the plug according to an embodiment as seen from another direction.

As illustrated in FIG. 1 and FIG. 2, a plug 10 includes a metal body 1, an insulator 2, and a conductor pin 3. In the present disclosure, the plug 10 may be referred to, for example, as a coaxial connector or a launcher. The plug 10 refers to a component to be fitted into a receptacle 6 described below.

The metal body 1 includes a first surface 11s, a second surface 12s opposite the first surface 11s, and a first through-hole 1o penetrating from the first surface 11s to the second surface 12s. The metal body 1 may be rectangular or disc-shaped in plan view. Here, the first surface 11s can be defined as a surface to be in contact with the receptacle 6 described below. The second surface 12s can be defined as a surface that is to face a wall 46 described below.

Being disc-shaped simply requires that a first outer edge 11e have a circular shape including an oval shape. The first outer edge 11e is not necessarily required to be in the shape of a perfect circle. When the metal body 1 is circular in shape, the metal body 1 can be easily manufactured, for example, by cutting. Force applied to the metal body 1 when the receptacle 6 presses the metal body 1 can also be relieved.

Although the shape of the first through-hole 1o is circular in plan view in an embodiment, the first through-hole 1o may be, for example, polygonal in shape. The first through-hole 1o having a circular shape can be easily made by processing the metal body 1.

In an embodiment, the first through-hole 1o may at least partially overlap a center portion of the metal body 1. With this configuration, the first through-hole 1o can be easily made by processing the metal body 1.

When the metal body 1 is disc-shaped, the diameter of the metal body 1 is, for example, equal to or greater than 1.0 mm and equal to or less than 5.0 mm. The height of the metal body 1 (i.e., dimension in the x direction) may be, for example, equal to or greater than 0.5 mm and equal to or less than 3.0 mm. When the shape of the first through-hole 1o is circular in plan view, the diameter of the first through-hole 1o is, for example, equal to or greater than 0.25 mm and equal to or less than 1.5 mm.

The material of the metal body 1 is, for example, a metal material such as copper, iron, tungsten, molybdenum, nickel, or cobalt, or an alloy containing such metal materials. The metal body 1 may be one metal sheet or a laminate of a plurality of metal sheets. When the material of the metal body 1 is the metal material described above, the surface of the metal body 1 may be plated with nickel, gold, or the like by an electroplating method or an electroless plating method to reduce oxidation corrosion. The metal body 1 may be referred to as a component generally called a flange.

The insulator 2 is disposed in the first through-hole 1o. The insulator 2 includes a third surface 23s disposed on the side of the first surface 11s, a fourth surface 24s opposite the third surface 23s, and a second through-hole 2o penetrating from the third surface 23s to the fourth surface 24s. The second through-hole 2o may be formed by inserting the conductor pin 3 described below into the insulator 2 before curing.

The material of the insulator 2 may be, for example, silica glass containing silicon dioxide ($SiO_2$) as a main component. The "main component" in the present disclosure may be any component having at least the highest content and is, for example, a component with a mass percent concentration of 50% or more. The insulator 2 may be of so-called high-melting glass or of low-melting glass. Specifically, low-melting glass refers to amorphous or crystalline glass that softens, deforms, and flows at temperatures from 200° C. to 600° C. Crystalline glass refers to a composite of glass, which is amorphous, and a crystalline material. Applicable examples of low-melting glass include borosilicate glass, barium borosilicate glass, zinc borate glass, barium borate glass, high silicate glass, aluminophosphate glass, phosphate glass, zinc phosphate glass, alkali glass, bismuth silicate glass, bismuth borosilicate glass, bismuth zinc borate glass, lead borosilicate glass, lead borate glass, lead potash glass, and crystalline lead glass.

The conductor pin 3 is disposed in the second through-hole 2o and protrudes at least from the third surface 23s. That is, the conductor pin 3 is not necessarily required to protrude from the fourth surface 24s. When the conductor pin 3 does not protrude from the fourth surface 24s, the conductor pin 3 can be electrically connected to a circuit board 5, described below, by a bonding wire or brazing material. The conductor pin 3 may be disposed at the center of the first through-hole 1o and at the center of the second through-hole 2o.

The material of the conductor pin 3 may be any conductive material and may be, for example, a metal material such as copper, iron, tungsten, molybdenum, nickel, or cobalt, or an alloy containing such metal materials. The conductor pin 3 may be made of, for example, copper in a center portion thereof and another metal material (e.g., nickel) surrounding and covering the center portion.

When the conductor pin 3 is circular in plan view, the diameter of the conductor pin 3 may be, for example, equal to or greater than 0.1 mm and equal to or less than 0.5 mm.

The metal body 1 further includes a first groove 11K disposed in the first surface 11s. The first groove 11K is spaced from the first outer edge 11e. When the metal body 1 is pressed by the receptacle 6, this configuration can reduce deformation of the metal body 1 in a portion outside the first groove 11K (i.e., on a side of the first groove 11K adjacent to the first outer edge 11e) and can distribute stress applied to the metal body 1. This can reduce the possibility that the plug 10 will be damaged. In an embodiment, the metal body 1 may include a plurality of first grooves 11K.

The configuration described above allows a bonding material 7, described below, to be retained in the first groove 11K. This can thus reduce the possibility that the bonding material 7 will spread more than necessary over the first surface 11s.

Figure 4:
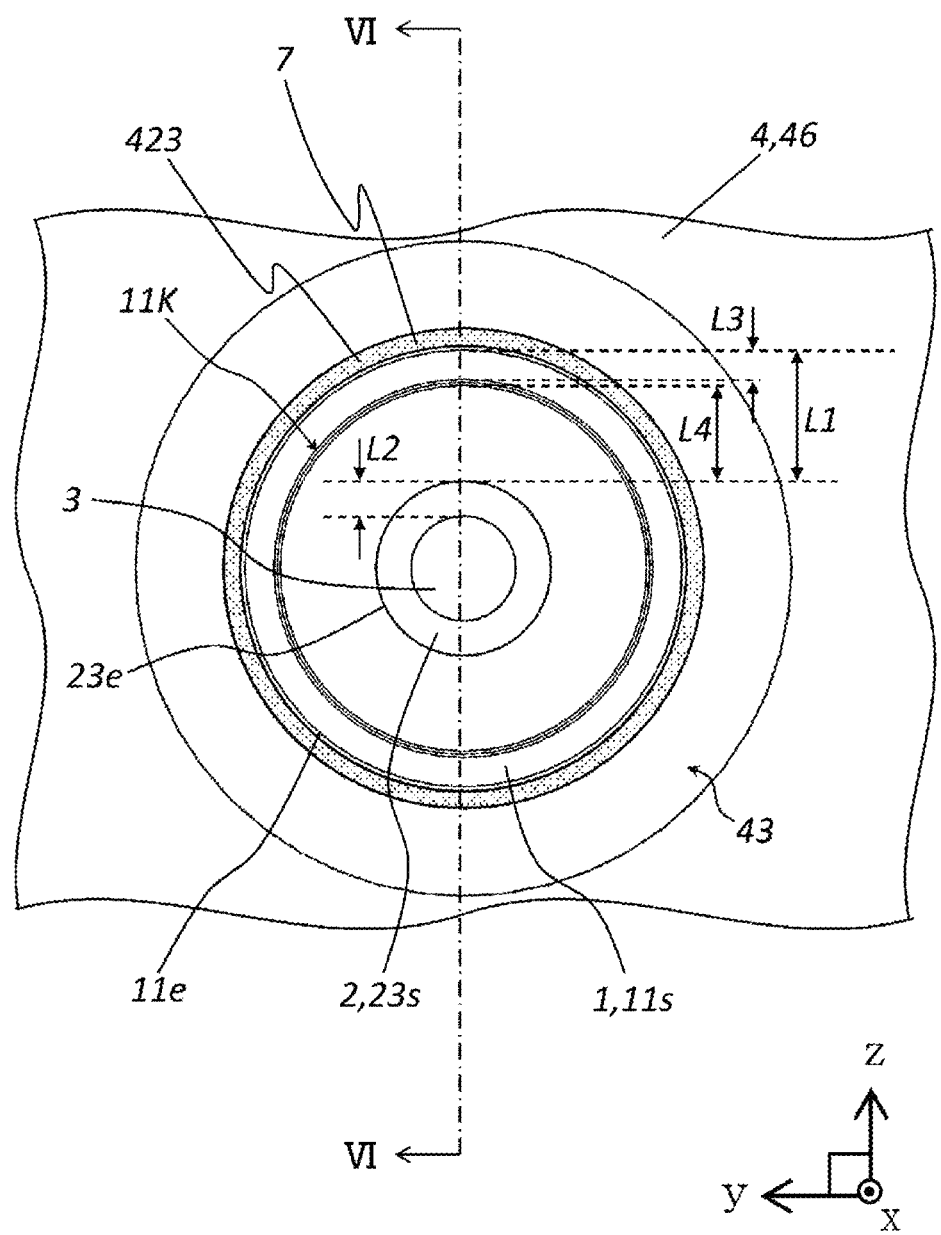
FIG. 4 is a plan view of the plug and the electronic component storing package according to an embodiment.

As illustrated in FIG. 4, in the present disclosure, a distance L3 from the first groove 11K to the first outer edge 11e may be constant or may change. When the distance L3 from the first groove 11K to the first outer edge 11e is constant, the first groove 11K can be easily formed by cutting.

In plan view, a width W of the first groove 11K may be constant. This configuration can relatively uniformly distribute stress applied to the metal body 1, and thus can further reduce the possibility that the plug 10 will be damaged. The width W of the first groove 11K may be, for example, equal to or greater than 0.05 mm and equal to or less than 0.3 mm. The depth of the first groove 11K may be, for example, equal to or greater than 0.01 mm and equal to or less than 0.25 mm. The depth of the first groove 11K may be referred to as a distance from the first surface 11s to the bottom of the first groove 11K in cross-sectional view.

The first groove 11K may be disposed along the first outer edge 11e. This configuration allows the first groove 11K to be easily formed in the metal body 1 by cutting or the like. This configuration can relatively uniformly distribute stress applied to a portion of the metal body 1 outside the first groove 11K, and thus can reduce the possibility that the metal body 1 will deform.

In the present disclosure, the first groove 11K being disposed along the first outer edge 11e may mean that the shape of the first groove 11K is similar to the shape of the first outer edge 11e. When the metal body 1 is circular, the first groove 11K being disposed along the first outer edge 11e may mean that the distance L3 from the first groove 11K to the first outer edge 11e is constant.

As illustrated in FIG. 4, in plan view, a distance L1 from the insulator 2 to the first outer edge 11e of the metal body 1 is greater than a distance L2 from the conductor pin 3 to a second outer edge 23e of the insulator 2. In other words, the thickness (or dimension in the y direction or z direction) of the metal body 1 is greater than the thickness (or dimension in the y direction or z direction) of the insulator 2. This configuration increases the area of contact between a conductive portion 62 of the receptacle 6, described below, and the metal body 1, and thus can relieve stress applied to the entire metal body 1 more than when the distance L1 from the insulator 2 to the first outer edge 11e of the metal body 1 is smaller than the distance L2 from the conductor pin 3 to the second outer edge 23e of the insulator 2. Therefore, the possibility of deformation of the metal body 1 and the possibility of fall of the insulator 2 from the metal body 1 can be reduced. The possibility that the insulator 2 and the conductor pin 3 will be deformed or damaged by deformation of the metal body 1 can also be reduced.

The first groove 11K may be annular in plan view. In other words, the first groove 11K may extend without interruption. When the plug 10 is bonded to the wall 46 with the bonding material 7 described below, the bonding material 7 is retained in the first groove 11K. This can reduce the possibility that the bonding material 7 will spread over the first surface 11s more than necessary. The configuration described above can relatively uniformly distribute stress applied to the metal body 1, and thus can further reduce the possibility that the plug 10 will be damaged.

In plan view, the distance L3 from the first groove 11K to the first outer edge 11e may be smaller than a distance L4 from the second outer edge 23e to the first groove 11K. In other words, the first groove 11K may be disposed closer to the first outer edge 11e than to the second outer edge 23e. The first groove 11K is simply required to be closer to the first outer edge 11e than an area where the first surface 11s of the metal body 1 is in contact with the conductive portion 62 is. That is, the first groove 11K is not required to be in contact with the conductive portion 62. This configuration can reduce the possibility that on the first surface 11s, the bonding material 7 will spread to a position where the conductive portion 62 is in contact with the first surface 11s. This can provide stable contact between the receptacle 6 and the first surface 11s of the plug 10. If the bonding material 7 spreads to the position where the conductive portion 62 of the receptacle 6 is in contact with the first surface 11s, the resulting gap in the contact area of the receptacle 6 and the first surface 11s may cause impedance fluctuation. The configuration described above can provide an accurate fit between the conductive portion 62 of the receptacle 6 and the plug 10. This can reduce the possibility of impedance fluctuation resulting from misalignment between the receptacle 6 and the plug 10.

More specifically, the distance L4 from the second outer edge 23e to the first groove 11K may be 1.2 times to 3 times the distance L3 from the first groove 11K to the first outer edge 11e.

The metal body 1 may include a side surface 13s and an inclined surface 14s. The side surface 13s is configured to connect the first surface 11s to the second surface 12s. The inclined surface 14s may extend at an angle from the second surface 12s to the side surface 13s. In other words, the metal body 1 may have a fillet shape on the side of the second surface 12s. When the metal body 1 is pressed by the receptacle 6, this configuration can reduce the possibility that collision between a first recess 41, described below, and the metal body 1 will damage the metal body 1 and/or the wall 46. The side surface 13s can be defined as a surface that faces the inner wall surface of the first recess 41 when the plug 10 is in the first recess 41.

Figure 7:
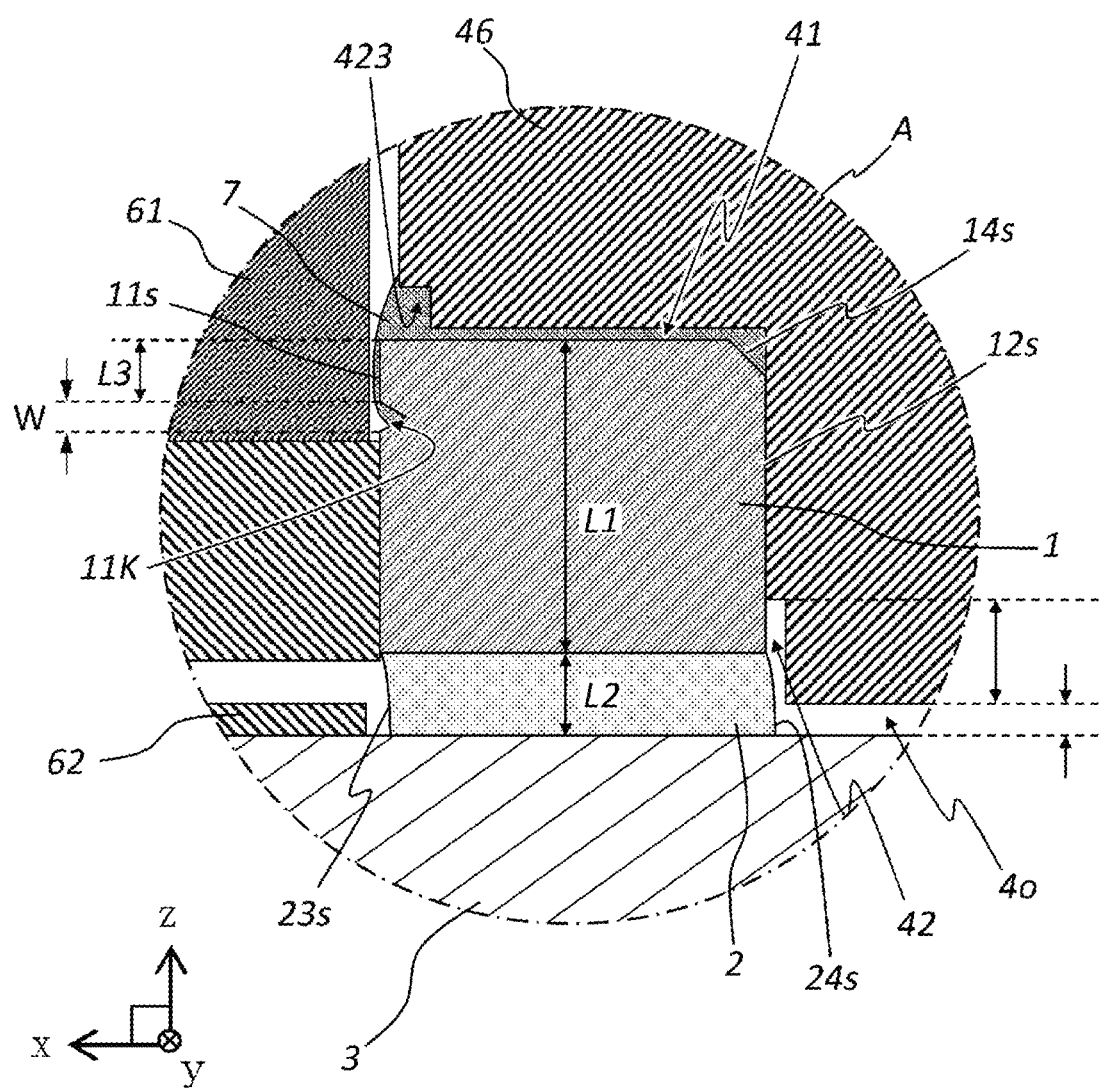
FIG. 7 is an enlarged view of a major part A illustrated in FIG. 6.

As illustrated in FIG. 7, the bonding material 7 can be retained between the first recess 41 and the inclined surface 14s. This can improve bonding strength between the plug 10 and the wall 46. Although the inclined surface 14s is a straight line in cross-sectional view in an embodiment, it may have a curved shape. More specifically, the inclined surface 14s may have a curve that bulges in a direction away from the insulator 2.

As illustrated in FIG. 1 and FIG. 2, when a direction in which the conductor pin 3 extends is defined as a first direction, a dimension Lx3 of protrusion of the conductor pin 3 from the third surface 23s in the first direction may be equal to or greater than a dimension Lx4 of protrusion of the conductor pin 3 from the fourth surface 24s in the first direction. Here, the first direction is, for example, the x direction in the drawings. When the receptacle 6 is attached to the side of the third surface 23s, the configuration described above increases a contact area for fitting into the conductive portion 62 of the receptacle 6, and thus can reduce the possibility that the receptacle 6 and the plug 10 will be separated. Additionally, when the dimension Lx4 of protrusion of the conductor pin 3 from the fourth surface 24s in the first direction is shorter than the dimension Lx3 of protrusion of the conductor pin 3 from the third surface 23s in the first direction, the amount of protrusion of the conductor pin 3 in a box 4 can be reduced. This can increase a space for accommodating the electronic component 9 in the box 4.

When the dimension Lx3 of protrusion of the conductor pin 3 from the third surface 23s in the first direction is equal to the dimension Lx4 of protrusion of the conductor pin 3 from the fourth surface 24s in the first direction, the conductor pin 3 protrudes by the same amount from the plug. Thus, the weight of the plug 10 is balanced between the sides of the first surface 11s and the second surface 12s. This can reduce the possibility that the plug 10 will be tilted when the plug 10 is positioned in the first recess 41 described below.

Increasing the dimension Lx4 of protrusion from the fourth surface 24s can increase the area of electrical contact between the conductor pin 3 and a wiring conductor 52 described below, and can stabilize conduction.

As illustrated in FIG. 7, in cross-sectional view, the width W of the first groove 11K may decrease from the first surface 11s toward the second surface 12s. In other words, in cross-sectional view, the first groove 11K may be tapered. When the metal body 1 is pressed by the receptacle 6, this configuration can efficiently distribute stress applied to the metal body 1. The shape of the first groove 11K in cross-sectional view is not limited to a triangular shape as illustrated in FIG. 7. For example, one or two sides of the first groove 11K may have a curved shape.

The tip of the first groove 11K is not necessarily required to be sharp. The tip of the first groove 11K may be rounded or flat. That is, the first groove 11K may be trapezoidal in cross-sectional view. Here, the "tip of the first groove 11K" refers to a portion closest to the second surface 12s.

As illustrated in FIG. 7, the third surface 23s may be concave toward the inside. This configuration can reduce the possibility that the third surface 23s will be brought into contact with the receptacle 6, as compared to when the third surface 23s is convex toward the outside. The first surface 11s and the receptacle 6 can thus be accurately brought into contact. In the present disclosure, the term inside can be defined as a direction from the third surface 23s toward the fourth surface 24s (e.g., negative direction of the x axis in the drawing). In an electronic component storing package 100 described below, the term inside can be referred to as a direction toward a region surrounded by the box 4. On the other hand, the term outside can be defined as a direction from the fourth surface 24s toward the third surface 23s (e.g., positive direction of the x axis in the drawing). In the electronic component storing package 100 described below, the term outside can be referred to as a direction away from the region surrounded by the box 4.

Figure 8:
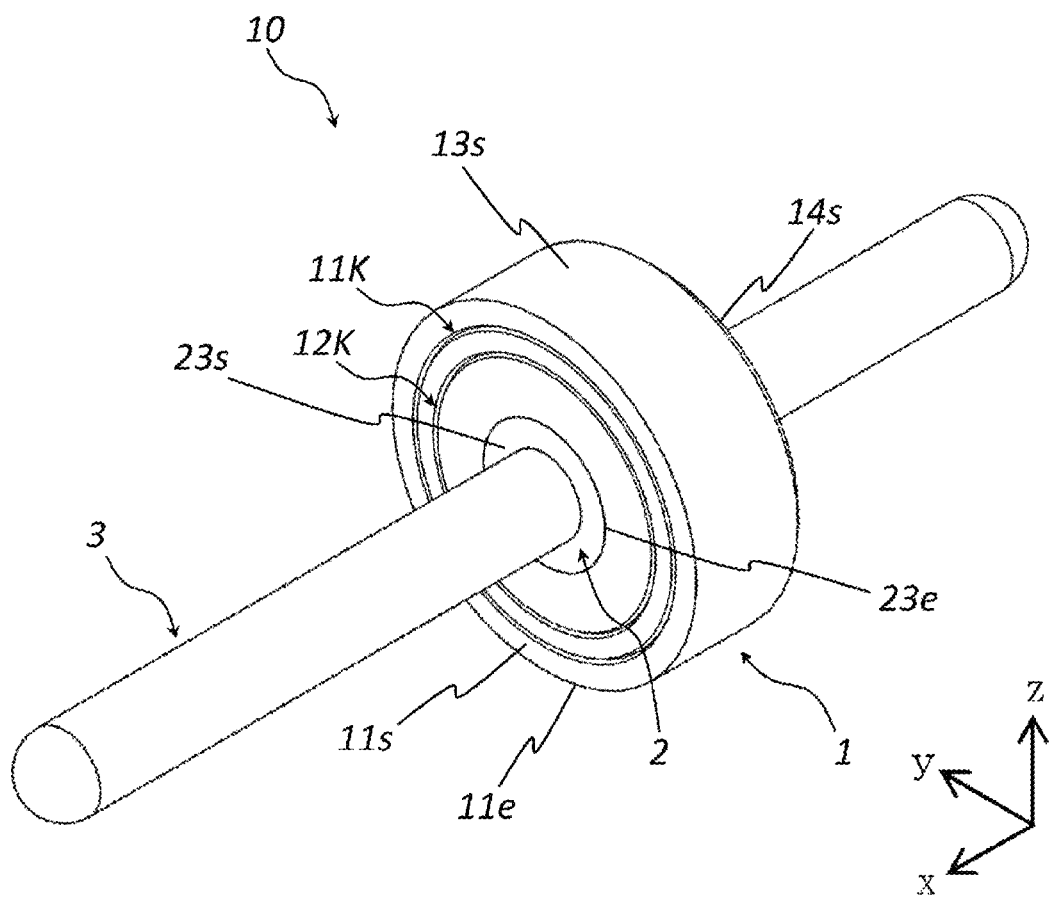
FIG. 8 is a perspective view of a plug according to another embodiment.

As illustrated in FIG. 8, the metal body 1 may include one or more second grooves 12K spaced from the first groove 11K. This configuration can more effectively reduce the possibility that the bonding material 7 will spread on the first surface 11s. The second groove 12K may be annular or may be partially interrupted in plan view. The metal body 1 may include a plurality of second grooves 12K.

(Electronic Component Storing Package)

Figure 3:
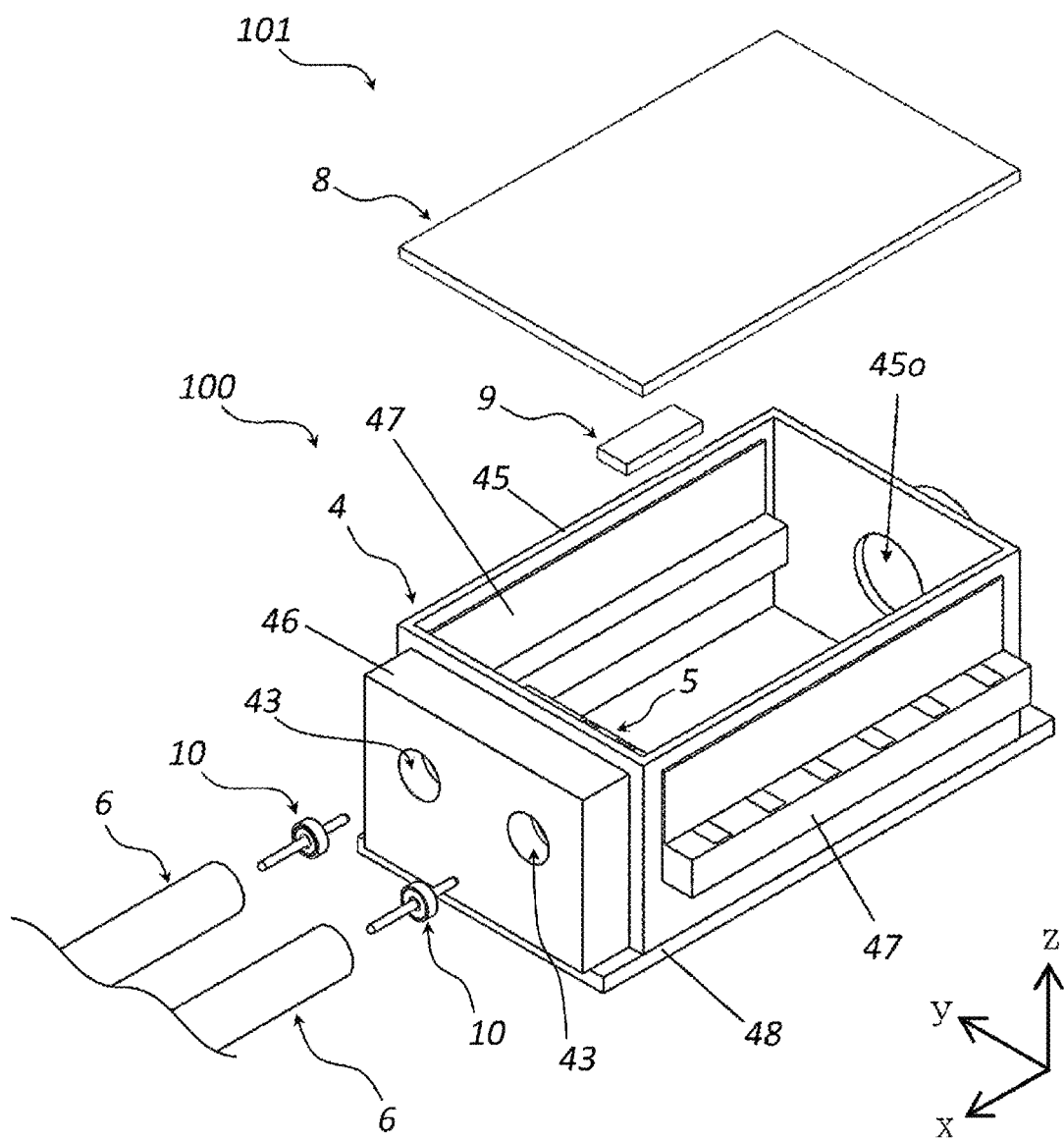
FIG. 3 is an exploded perspective view of an electronic component storing package and an electronic module according to an embodiment.

As illustrated in FIG. 3, in an embodiment, the electronic component storing package 100 includes the plug 10 described above and the box 4.

Figure 5:
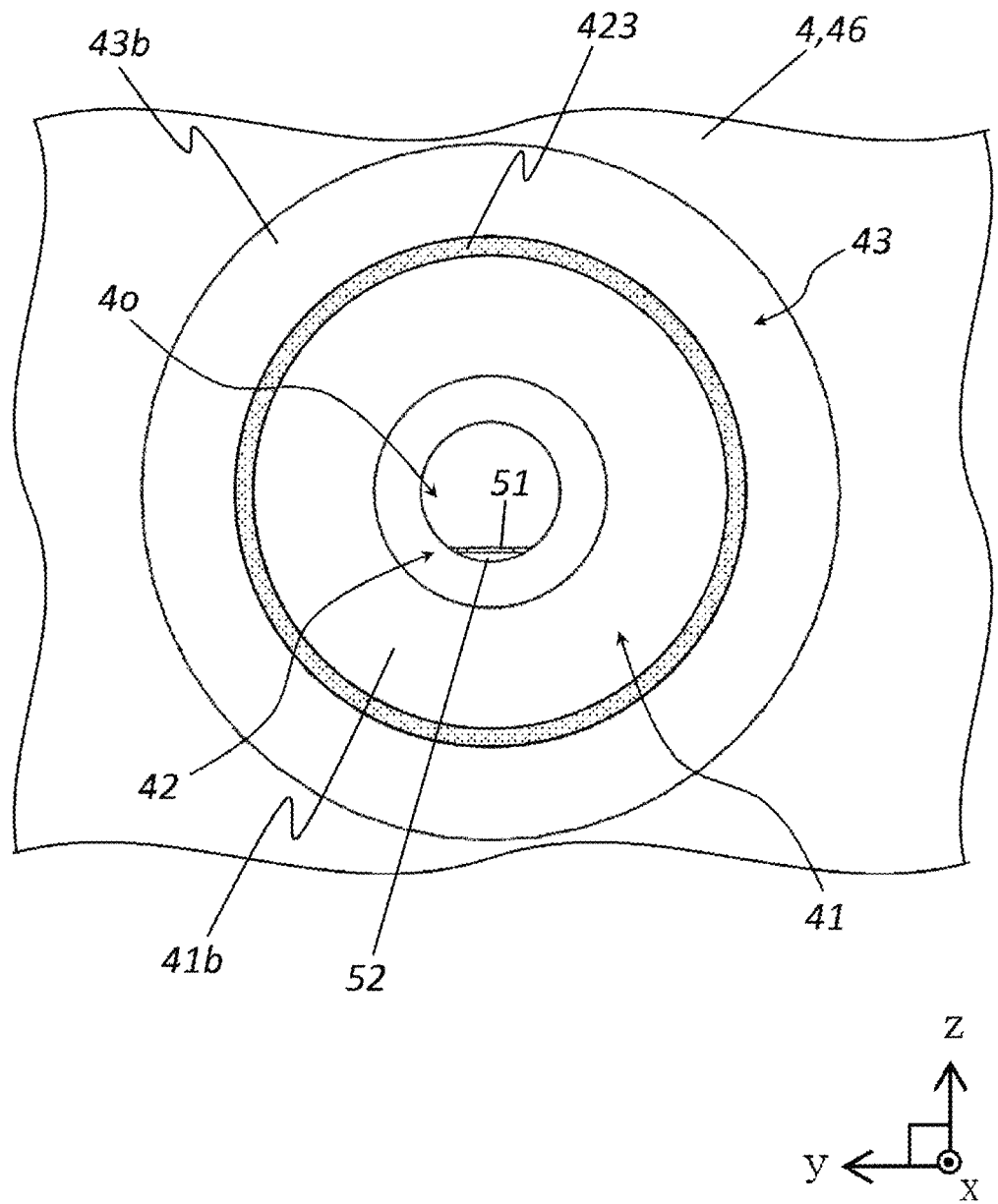
FIG. 5 is a diagram with the plug in FIG. 4 omitted.

As illustrated in FIG. 5, the box 4 includes the first recess 41 in which the plug 10 is disposed, and a third through-hole 4o connected to the first recess 41 and configured to allow the conductor pin 3 to pass therethrough. The first recess 41 includes a first bottom surface 41b in contact with the second surface 12s. This configuration allows the plug 10 to be stably secured to the box 4.

The first recess 41 may be shaped to follow the contour of the metal body 1 in plan view. This configuration allows the metal body 1 to be stably disposed in the first recess 41.

The third through-hole 4o extends to a special area surrounded by the box 4. The third through-hole 4o is circular but may be, for example, rectangular in plan view. When the third through-hole 4o is circular in plan view and the conductor pin 3 is cylindrical in shape, the distance between the inner wall surface of the third through-hole 4o and the conductor pin 3 can be brought closer to a constant value, and this can reduce impedance fluctuation.

More specifically, as illustrated in FIG. 3, the box 4 may include the wall 46, a frame 45, a terminal unit 47, and a substrate 48 in an embodiment. In this case, the wall 46 may include the first recess 41 and the third through-hole 4o described above.

The material of the frame 45 is, for example, a metal material such as copper, iron, tungsten, molybdenum, nickel, or cobalt, or an alloy containing such metal materials. The material of the frame 45 may be an insulating material, and may be, for example, an aluminum oxide sintered body, a mullite sintered body, a silicon carbide sintered body, an aluminum nitride sintered body, or a ceramic material such as glass ceramics.

The frame 45 may include a light transmitting portion 450 penetrating the frame 45 from the inside to the outside. When the electronic component 9 is, for example, an optical semiconductor element, such as a semiconductor laser (laser diode (LD)) or a photo diode (PD), light can be received and emitted through the light transmitting portion 450. The light transmitting portion 450 may be disposed in a surface facing the wall 46 in which the plug 10 is disposed.

The material of the wall 46 may be either the same as or different from the material of the frame 45. The material of the substrate 48 may be either the same as or different from the material of the frame 45 and the wall 46.

The terminal unit 47 serves to provide conduction between the inside and the outside of the box 4. The terminal unit 47 may be, for example, a ceramic member with a conductor formed thereon.

The circuit board 5 may be disposed in the box 4. The circuit board 5 may include an insulating substrate 51 and the wiring conductor 52 disposed on the insulating substrate 51. In this case, the conductor pin 3 protruding from the third through-hole 4o may be electrically connected to the wiring conductor 52.

As illustrated in FIG. 7, the box 4 may further include a second recess 42 disposed in the first bottom surface 41b. The second recess 42 may be spaced from the insulator 2. The diameter of the second recess 42 may be smaller than the diameter of the first recess 41 and greater than the diameter of the insulator 2 and the diameter of the third through-hole 4o. More specifically, the second recess 42 is not required to be in contact with the insulator 2. Even if, for example, the fourth surface 24s is curved inward due to manufacturing error, the configuration described above can provide stable contact between the second surface 12s and the first bottom surface 41b and reduce the possibility that the plug 10 will be tilted or displaced.

Figure 6:
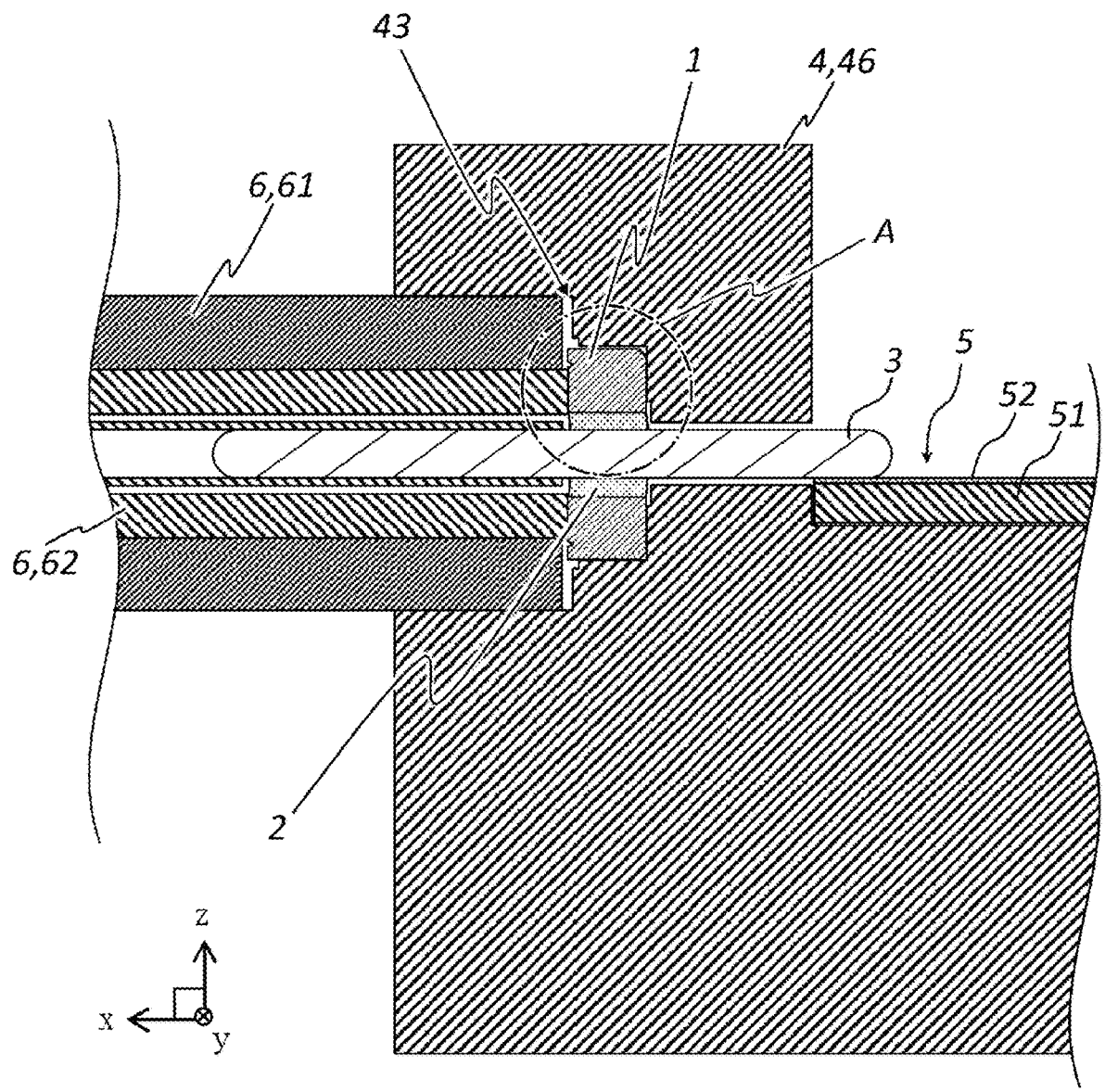
FIG. 6 is a diagram taken along line VI-VI in the electronic component mounting package illustrated in FIG. 4.

As illustrated in FIG. 5 to FIG. 7, the box 4 may further include a third recess 43 continuous with the first recess 41 and disposed opposite the third through-hole 4o. The third recess 43 may include a second bottom surface 43b where the first recess 41 is disposed. The third recess 43 may be greater than the first recess 41 in plan view. The third recess 43 may be a space for retaining the receptacle 6 described below. In this case, the third recess 43 and a case 61 of the receptacle 6 may have thread grooves engaging with each other, so that the receptacle 6 is fitted into the third recess 43. Here, the third recess 43 being greater than the first recess 41 in cross-sectional view means that the third recess 43 is spatially greater. More specifically, when the third recess 43 is circular in plan view as illustrated in FIG. 5, the third recess 43 is simply required to be greater in diameter than the first recess 41.

In cross-sectional view, the first surface 11s may be disposed outside the second bottom surface 43b (in the x direction in the drawing). This configuration allows the conductive portion 62 of the receptacle 6 to be stably in contact the first surface 11s. This can reduce the possibility that the value of impedance will deviate from a desired value.

The bonding material 7 may be further provided between the box 4 and the plug 10. The box 4 may further include a stepped portion 423 configured to connect the third recess 43 to the first recess 41 and disposed in the second bottom surface 43b. The bonding material 7 may extend from a gap between the first recess 41 and the plug 10 to the stepped portion 423. This configuration can increase the amount of the bonding material 7 disposed between the metal body 1 and the box 4, and thus can improve the bonding strength between the plug 10 the box 4. As illustrated in FIG. 7, the bonding material 7 can extend from the stepped portion 423 to the first groove 11K. This can further improve the bonding strength between the plug 10 and the box 4.

The bonding material 7 may be any material with which the box 4 can be sealed so as not to allow air to pass in and out of the box 4. Examples of the bonding material 7 include gold-tin, silver epoxy resin, solder, and silver paste. When the surface of the metal body 1 is plated with gold, the bonding material 7 may be any material having a melting point lower than gold. This configuration can reduce the possibility that the gold plating on the surface of the metal body 1 will melt.

As illustrated in FIG. 3, FIG. 6, and FIG. 7, the electronic component storing package 100 further includes the receptacle 6 into which the conductor pin 3 is fitted and with which the first surface 11s comes into contact. The receptacle 6 may include the conductive portion 62 into which the conductor pin 3 is fitted and the case 61 surrounding the conductive portion 62.

(Electronic Module)

As illustrated in FIG. 3, the electronic module 101 includes the electronic component storing package 100, the electronic component 9 contained in the box 4, and a lid 8 disposed over the box 4.

The electronic component 9 may be a component configured to perform signal processing, such as converting a radio signal or an optical signal into an electrical signal, or converting an electrical signal into an optical signal or a radio signal. In an embodiment, the electronic component 9 may be disposed directly on the substrate 48, or may be disposed indirectly on the substrate 48, with a heat dissipating member therebetween. The electronic component 9 may be disposed, for example, on the circuit board 5 described above.

Examples of the electronic component 9 include a semiconductor laser (LD), an optical semiconductor element such as a photo diode (PD), a semiconductor integrated circuit element, a sensor element such as an optical sensor, and a power amplifier IC. The electronic component 9 can be formed by a semiconductor material, such as gallium arsenic or gallium nitride. When the electronic component 9 is an optical semiconductor element, the electronic module 101 can be used as an optical communication module.

The lid 8 is disposed over the frame 45. The lid 8 is configured to protect the electronic component 9 together with the frame 45. The material of the lid 8 is, for example, a metal material such as iron, copper, nickel, chromium, cobalt, molybdenum, or tungsten, or an alloy containing such metal materials.

The electronic module 101 may further include a seal ring disposed between the lid 8 and the frame 45. The seal ring may be disposed on the frame 45 and configured to surround the electronic component 9 in plan view. When the frame 45 is not provided with a seal ring thereon, the lid 8 may be bonded onto the frame 45 with solder, brazing material, glass, or an adhesive, such as resin adhesive, therebetween.

Various combinations of embodiments and variations are not limited to examples of the embodiments described above. Combinations of embodiments alone and combinations of variations alone are also possible.

INDUSTRIAL APPLICABILITY

The present disclosure can be used as a plug, an electronic component storing package including the same, and an electronic module including the same.

REFERENCE SIGNS 1 metal body
11s first surface
11e first outer edge
12s second surface
13s side surface
14s inclined surface
1o first through-hole
11K first groove
12K second groove
2 insulator
23s third surface
24s fourth surface
23e second outer edge
2o second through-hole
3 conductor pin
4 box
41 first recess
41b first bottom surface
42 second recess
43 third recess
43b second bottom surface
423 stepped portion
4o third through-hole
45 frame
45o light transmitting portion
46 wall
47 terminal unit
48 substrate
5 circuit board
51 insulating substrate
52 wiring conductor
6 receptacle
61 case
62 conductive portion
7 bonding material
8 lid
9 electronic component
10 plug
100 electronic component storing package
101 electronic module

The invention claimed is:

1. A plug comprising:
a metal body comprising a first surface facing a receptacle, a second surface opposite the first surface, and a first through-hole penetrating from the first surface to the second surface;
an insulator disposed in the first through-hole and comprising a third surface disposed on a side of the first surface, a fourth surface opposite the third surface, and a second through-hole penetrating from the third surface to the fourth surface; and
a conductor pin disposed in the second through-hole and protruding at least from the third surface,
wherein the metal body further comprises a first groove disposed in the first surface, and
wherein the first groove is spaced from a first outer edge of the metal body.

2. The plug according to claim 1, wherein the first groove is disposed along the first outer edge.

3. The plug according to claim 1, wherein in plan view, a minimum distance L1 from the insulator to the first outer edge is greater than a minimum distance L2 from the conductor pin to a second outer edge of the insulator.

4. The plug according to claim 2, wherein the first groove is annular in plan view.

5. The plug according to claim 1, wherein the metal body comprises a side surface configured to connect the first surface to the second surface, and an inclined surface extending at an angle from the second surface to the side surface.

6. The plug according to claim 1, wherein the metal body is disc-shaped in plan view.

7. The plug according to claim 1, wherein in cross-sectional view, a width of the first groove decreases from the first surface toward the second surface.

8. The plug according to claim 3, wherein, in plan view, a minimum distance L3 from the first groove to the first outer edge is smaller than a minimum distance L4 from the second outer edge to the first groove.

9. The plug according to claim 1, wherein the third surface is concave toward an inside.

10. An electronic component storing package comprising:
the plug according to claim 1; and
a box comprising a first recess in which the plug is disposed, and a third through-hole connected to the first recess and configured to allow the conductor pin to pass therethrough, and
wherein the first recess comprises a first bottom surface in contact with the second surface.

11. The electronic component storing package according to claim 10, wherein
the box further comprises a second recess disposed in the first bottom surface,
the second recess is spaced from the insulator, and
a diameter of the second recess is smaller than a diameter of the first recess, and greater than a diameter of the insulator and a diameter of the third through-hole.

12. The electronic component storing package according to claim 10, wherein
the box further comprises a third recess continuous with the first recess and disposed opposite the third through-hole,
the third recess comprises a second bottom surface where the first recess is disposed, and the third recess is greater than the first recess in plan view, and
in cross-sectional view, the first surface is disposed outside the second bottom surface.

13. The electronic component storing package according to claim 12, further comprising a bonding material disposed between the box and the plug,
wherein the box further comprises a stepped portion configured to connect the third recess to the first recess and disposed in the second bottom surface, and
wherein the bonding material extends from a gap between the first recess and the plug to the stepped portion.

14. The electronic component storing package to claim 10, further comprising the receptacle into which the conductor pin is fitted, and with which the first surface comes into contact.

15. An electronic module comprising:
the electronic component storing package according to claim 10;
an electronic component contained in the box; and
a lid disposed over the box.

16. A plug comprising:
a metal body comprising a first surface, a second surface opposite the first surface, and a first through-hole penetrating from the first surface to the second surface;
an insulator disposed in the first through-hole and comprising a third surface disposed on a side of the first surface, a fourth surface opposite the third surface, and a second through-hole penetrating from the third surface to the fourth surface; and
a conductor pin disposed in the second through-hole and protruding at least from the third surface, and
wherein in plan view, the metal body is circular in shape and a minimum distance L1 from the insulator to the first outer edge is greater than a minimum distance L2 from the conductor pin to a second outer edge of the insulator.

17. An electronic component storing package comprising:
the plug according to claim 16; and
a box comprising a first recess in which the plug is disposed, and a third through-hole
connected to the first recess and configured to allow the conductor pin to pass therethrough, and
wherein the first recess comprises a first bottom surface in contact with the second surface.

18. A plug comprising:
a metal body comprising a first surface, a second surface opposite the first surface, and
a first through-hole penetrating from the first surface to the second surface;
an insulator disposed in the first through-hole and comprising a third surface disposed on a side of the first surface, a fourth surface opposite the third surface, and a second through-hole penetrating from the third surface to the fourth surface; and
a conductor pin disposed in the second through-hole and protruding at least from the third surface,
wherein the metal body further comprises a first groove disposed in the first surface, and
wherein the first groove is spaced from a first outer edge of the metal body and is exposed to an outside of the metal body.

19. The plug according to claim 18, wherein the first outer edge surrounds a circumference of the metal body and is exposed to an outside of the metal body.

20. The plug according to claim 18, wherein in plan view, a minimum distance L1 from the insulator to the first outer edge is greater than a minimum distance L2 from the conductor pin to a second outer edge of the insulator.

* * * * *